(12) United States Patent
Lee et al.

(10) Patent No.: US 12,154,769 B2
(45) Date of Patent: Nov. 26, 2024

(54) WINDOW FOR PLASMA OES DIAGNOSIS, AND PLASMA APPARATUS USING SAME

(71) Applicant: KOREA INSTITUTE OF FUSION ENERGY, Yuseong-gu (KR)

(72) Inventors: Kang Il Lee, Gunsan-si (KR); Yong Sup Choi, Gunsan-si (KR); Young Woo Kim, Hwaseong-si (KR); Jong Sik Kim, Gunsan-si (KR)

(73) Assignee: KOREA INSTITUTE OF FUSION ENERGY, Yuseong-gu (KR)

( * ) Notice: Subject to any disclaimer, the term of this patent is extended or adjusted under 35 U.S.C. 154(b) by 312 days.

(21) Appl. No.: 17/595,928

(22) PCT Filed: May 28, 2020

(86) PCT No.: PCT/KR2020/006887
§ 371 (c)(1),
(2) Date: Nov. 29, 2021

(87) PCT Pub. No.: WO2020/242207
PCT Pub. Date: Dec. 3, 2020

(65) Prior Publication Data
US 2022/0230858 A1   Jul. 21, 2022

(30) Foreign Application Priority Data

May 28, 2019  (KR) ........................ 10-2019-0062548

(51) Int. Cl.
*H01J 37/32* (2006.01)
(52) U.S. Cl.
CPC .. *H01J 37/32972* (2013.01); *H01J 37/32807* (2013.01)
(58) Field of Classification Search
CPC ........... H01J 37/32972; H01J 37/32807; H01J 37/3277; H01J 37/32917; H01J 37/32926;
(Continued)

(56) References Cited

U.S. PATENT DOCUMENTS

2001/0055888 A1\* 12/2001 Madan .................. C23C 14/568
                                                     438/758
2016/0141148 A1\*  5/2016 Sun .................... H01J 37/32972
                                                     156/345.24
(Continued)

FOREIGN PATENT DOCUMENTS

JP          2006104497         4/2006
JP          2006104497 A   *   4/2006
(Continued)

OTHER PUBLICATIONS

International Search Report and Written Opinion issued in Correspond PCT Application No. PCT/KR2020/006887, dated Sep. 11, 2020 (English Translation provided).

*Primary Examiner* — Charlee J. C. Bennett
(74) *Attorney, Agent, or Firm* — NORTON ROSE FULBRIGHT US LLP

(57) ABSTRACT

A window device for diagnosis of plasma OES (Optical Emission Spectroscopy), is disclosed and includes a housing including a first chamber and a second chamber horizontally adjacent to each other; a connection opening defined in one face of the housing and between the first and second chambers, the connection opening faces toward an opening through which light of plasma from a plasma chamber is exposed to the connection opening; an observation window opening defined in an opposite face of the housing opposite to the connection opening, the observation window opening is coaxial with the connection opening, the light of the plasma transmits through the observation window opening, and is incident to a light receiver of an OES sensor; an observation window positioned inside the observation window opening and in the housing; a winder and a rewinder installed in the first and second chambers, respectively; and a transparent film.

8 Claims, 1 Drawing Sheet

(58) Field of Classification Search
CPC ............. H01J 37/32935; C23C 16/545; C23C 14/362; C23C 16/488; C23C 16/52; H01L 21/67253
USPC ...................................... 156/345.24; 118/718
See application file for complete search history.

(56) References Cited

U.S. PATENT DOCUMENTS

2017/0040150 A1* 2/2017 Hsieh .................... C23C 14/564
2018/0286650 A1* 10/2018 Bullock ............... H04N 25/713
2020/0165721 A1* 5/2020 Morrison .............. C23C 16/401

FOREIGN PATENT DOCUMENTS

| KR | 20000014058 | 3/2000 |
| KR | 101347928 | 1/2014 |
| KR | 20160058490 | 5/2016 |
| KR | 20160134267 | 11/2016 |

* cited by examiner

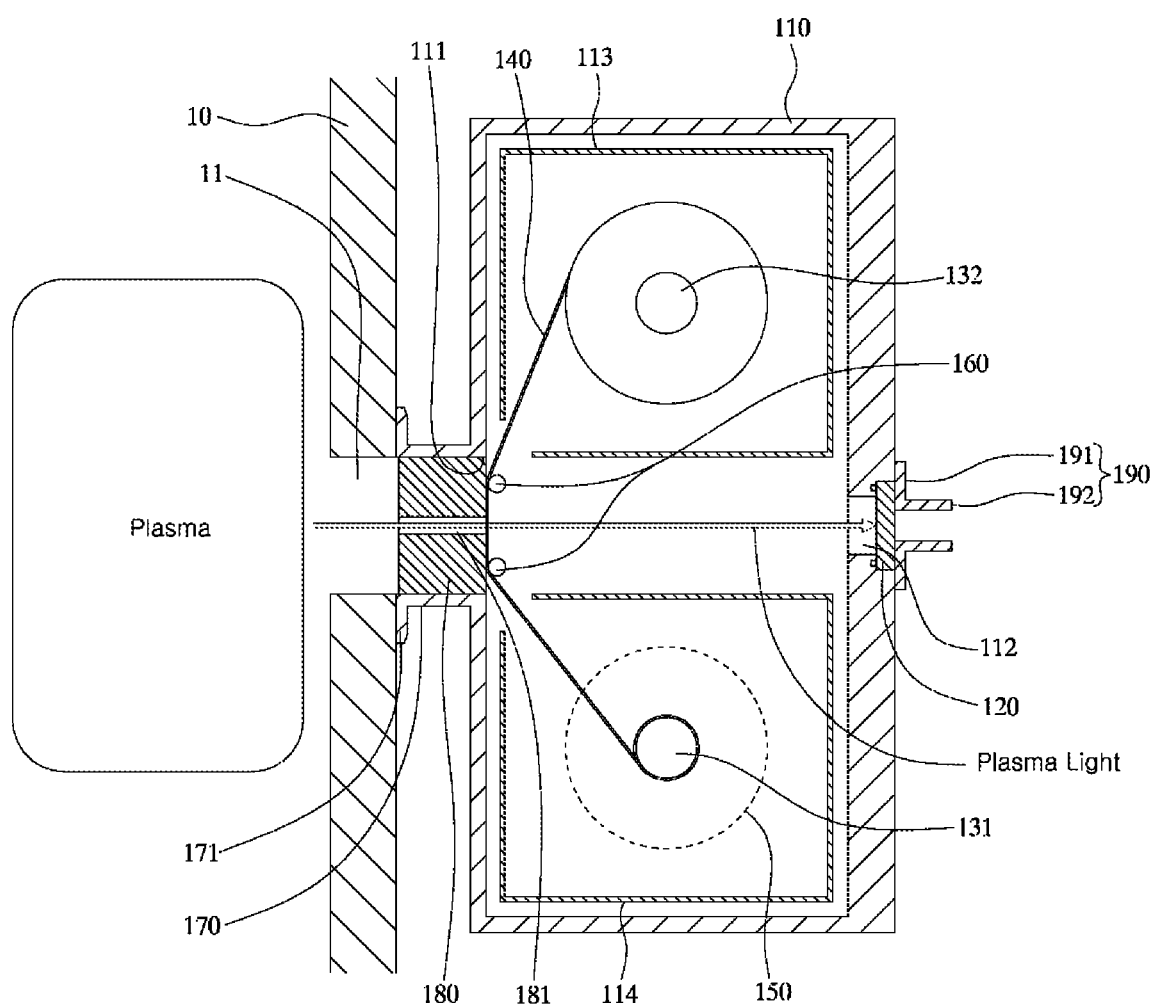

WINDOW FOR PLASMA OES DIAGNOSIS, AND PLASMA APPARATUS USING SAME

CROSS-REFERENCE TO RELATED APPLICATIONS

This application a national phase under 35 U.S.C. § 371 of International Application No. PCT/KR2020/006887, filed May 28, 2020, which claims priority to Korean Patent Application No. 10-2019-0062548, filed May 28, 2019, with the Korean Intellectual Property Office. The contents of each of the referenced applications are incorporated into the present application by reference.

FIELD

The present disclosure relates to a window device for diagnosing plasma OES (Optical Emission Spectroscopy), and more particularly, to a window device for diagnosing plasma OES that receives plasma light so that plasma diagnosis may be performed accurately.

DESCRIPTION OF RELATED ART

A process that may be performed on a semiconductor device using plasma may include a dry etching process or a chemical vapor deposition process. The process may use a plasma chamber that may generate plasma to perform the process. Therefore, a semiconductor substrate is placed on a substrate support in the plasma chamber. An inside of the plasma chamber is created under a predefined reaction condition. Then, the plasma is generated to perform the etching process and the chemical vapor deposition process.

When an abnormality occurs in a plasma process condition or anomalies occur in parts of plasma equipment, such as a mass flow controller, a RF source (radio frequency source), or a bias power, a plasma state changes. Thus, deposition or etching characteristics are changed accordingly. In this case, a quality of the process and reliability of the plasma equipment are deteriorated. In order to prevent this situation, a scheme for strictly monitoring the state of the plasma of the semiconductor apparatus is required.

A solution for monitoring the plasma state may use an OES (Optical Emission Spectroscopy) sensor. A plasma process diagnostic device using the OES sensor is disclosed in Korean Patent Application No. 10-2013-0090637. The plasma process diagnostic device according to this patent document includes multiple view ports that transmit light emitted from a process chamber to an outside, and multiple OES sensors connected to the view ports via optical cables.

However, the plasma process diagnostic device according to this patent document has a problem in that the view ports are easily contaminated because the view ports are directly installed in the process chamber. Thus, there is a difficulty in accurately diagnosing the plasma due to the contamination of the view ports.

DISCLOSURE

Technical Purposes

Therefore, a purpose of the present disclosure is to provide a window device for diagnosing plasma OES (Optical Emission Spectroscopy) in which contamination of an observation window that receives the plasma light is prevented, and the window device always receives the plasma light without lowering intensity of the plasma light so that the plasma state diagnosis may be performed accurately.

Technical Solutions

A first aspect of the present disclosure provides a window device for diagnosis of plasma OES (Optical Emission Spectroscopy), the window device comprising: a housing including a first chamber and a second chamber horizontally adjacent to each other; a connection opening defined in one face of the housing and between the first chamber and the second chamber, wherein the connection opening faces toward an opening through which light of plasma from a plasma chamber is exposed to the connection opening; an observation window opening defined in an opposite face of the housing opposite to the connection opening, wherein the observation window opening is coaxial with the connection opening, wherein the light of the plasma transmits through the observation window opening, and is incident to a light receiver of an OES sensor; an observation window positioned inside the observation window opening and in the housing; a winder and a rewinder installed in the first chamber and the second chamber, respectively; and a transparent film moving, in a roll-to-roll manner, from the rewinder to the winder while covering an inner face of the connection opening in the housing.

In one implementation, the window device further comprises contamination level identification means for identifying to contamination level of the transparent film exposed to the connection opening.

In one implementation, the window device further comprises a roll-to-roll driver, wherein when a contamination level identified by the contamination level identification means is greater than or equal to a predetermined value, the driver is configured to drive the winder and the rewinder such that the transparent film moves from the rewinder to the winder in a roll-to-roll manner by a predetermined length.

In one implementation, the window device further comprises: a connection opening sidewall extending outwardly from the connection opening while surrounding the connection opening; and a connection opening block received in an inner spaced defined by the connection opening sidewall, and having a through-hole defined therein.

In one implementation, the through-hole has an inner diameter of 1 to 5 mm.

In one implementation, the window device further comprises tension rollers respectively positioned at both opposing sides in a length direction of the connection opening so that the transparent film moves in the roll-to-roll manner while closely contacting an inner face of the connection opening.

In one implementation, the window device further comprises an optical fiber connector of the OES sensor installed out of the observation window opening.

In one implementation, the transparent film is heat-resistant and chemical-resistant.

A second aspect of the present disclosure provides a plasma apparatus including the window device for diagnosing plasma OES as defined above.

TECHNICAL EFFECTS

When using the window device for plasma OES diagnosis according to the present disclosure, the contamination of the observation window that receives plasma light for plasma state diagnosis may be prevented, and the window device always receives the plasma light without lowering intensity of the plasma light so that the plasma state diagnosis may be performed accurately.

BRIEF DESCRIPTION OF THE DRAWINGS

FIG. 1 is a cross-sectional view showing a configuration of a window device for plasma OES diagnosis according to an embodiment of the present disclosure.

DETAILED DESCRIPTIONS

Hereinafter, a window device for plasma OES diagnosis according to an embodiment of the present disclosure will be described in detail with reference to the accompanying drawings. The present disclosure may be variously modified and may take many forms. Thus, specific embodiments will be illustrated in the drawings and described in detail herein. However, the specific embodiments are not intended to limit the present disclosure thereto. It should be understood that all changes, equivalents thereto, or substitutes therewith are included in a scope and spirit of the present disclosure. In drawings, like reference numerals have been used for like elements. For simplicity and clarity of illustration, elements in the figures are not necessarily drawn to scale.

It will be understood that, although the terms "first", "second", "third", and so on may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure.

The terminology used herein is for the purpose of describing particular embodiments only and is not intended to limit the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or more other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram showing a configuration of a window device for plasma OES diagnosis according to an embodiment of the present disclosure.

Referring to FIG. 1, the window device for plasma OES diagnosis according to an embodiment of the present disclosure includes a housing 110, a connection opening 111, an observation window opening 112, an observation window 120, a winder 131, a rewinder 132, a transparent film 140, a tension roller 160, contamination level identification means (not shown), and a roll-to-roll driver 150.

The housing 110 includes a first chamber 113 and a second chamber 114 adjacent to each other. A shape of the housing 110 is not particularly limited. For example, the housing 110 may have a rectangular parallelepiped shape.

The connection opening 111 is positioned between the first chamber 113 and the second chamber 114 and is defined in one face of the housing 110 and communicates with an opening 11 through which plasma light is exposed and thus receives the plasma light from a plasma chamber 10.

In this connection, the plasma chamber 10 refers to a process chamber that provides a reaction space for a process such as a thin film deposition on and an etching of a semiconductor substrate using plasma. The process chamber is supplied with a carrier gas and a process gas for plasma generation.

The observation window opening 112 is defined in an opposite face of the housing 110 opposite to the connection opening 111. In this connection, the observation window opening 112 is coaxial with the connection opening 111, such that the plasma light entering the connection opening 111 is transmitted thereto. The observation window opening 112 connects to a light receiver of an OES device.

The observation window 120 is positioned inside the observation window opening 112 and in the housing 110. Any material that may transmit the plasma light therethrough may be used as a material of the observation window 120. For example, the observation window 120 may be made of a quartz material.

The winder 131 and the rewinder 132 are installed inside the first chamber 113 and the second chamber 114, respectively. In one example, the rewinder 132 may be installed in the first chamber 113, while the winder 131 may be installed in the second chamber 114. The transparent film 140 may be wound around the rewinder 132. The winder 131 may pull the transparent film 140 wound around the rewinder 132 and wind around the winder.

The transparent film 140 may move in a roll-to-roll manner from the winder 132 to the winder 131 within the housing 110. In this connection, the transparent film 140 may move in a roll-to-roll manner within the housing 110 while covering an inner face of the connection opening 111. To this end, the housing 110 receives two tension rollers 160 respectively positioned on both opposing sides of the connection opening 111. The tension roller 160 may support the transparent film 140 on an opposite face to one face of the transparent film 140 facing toward the inner face of the connection opening 111 so that the transparent film 140 is held in a tensioned manner in a form of a plane perpendicular to a direction in which the connection opening 111 faces toward the process chamber. The transparent film 140 may include a heat-resistant and chemical-resistant film. For example, the film 140 may be a polymer film made of PE, PP, or PI.

The contamination level identification means (not shown) refers to a device for identifying a contamination level of the transparent film 140 exposed through the connection opening 111 to the plasma. A predetermined value of the contamination level of the transparent film 140, that is, an upper limit value of the contamination level of the transparent film 140 may be preset in the contamination level identification means. In one example, the contamination level identification means may be a vision inspection device.

The roll-to-roll driver 150 drives the winder 131 and the winder 132. The roll-to-roll driver 150 may be a stepping motor mechanically connected to the rewinder 132. The roll-to-roll driver 150 is electrically connected to the contamination level identification means. When the contamination level of the transparent film 140 identified by the contamination level identification means is the upper limit of the contamination level, the roll-to-roll driver 150 may drive the winder 131 and the winder 132 to move, in a roll-to-roll manner, the transparent film 140 by a predetermined length. The predetermined length may be set to be greater than or equal to a length of the transparent film 140 by which the film 140 is supported on the tension roller 160.

In one example, the window device for plasma OES diagnosis according to an embodiment of the present disclosure further includes a connection opening sidewall 170 and a connection opening block 180.

The connection opening sidewall 170 extends outwardly from the connection opening 111 while surrounding the connection opening 111. That is, the connection opening sidewall 170 extends from a position of the housing at which the connection opening 111 is present and in a form of a tube surrounding the connection opening 111. A distal end of the connection opening sidewall 170 surrounds the opening 11 of the plasma chamber 10 and is connected to the plasma chamber 10. The connection opening sidewall 170 may have a flange portion 171 at the distal end thereof for connection to the plasma chamber 10. The flange portion 171 may be closely fixed to an outer surface of the plasma chamber 10 so that the housing 110 is connected to the plasma chamber 10.

The connection opening block 180 is inserted into an inner space defined by the connection opening sidewall 170 and has a through-hole 181 defined therein. A cross-sectional shape of the connection opening block 180 corresponds to a cross-sectional shape of the connection opening sidewall 170. The through-hole 181 extends in a parallel manner to a longitudinal direction of the connection opening sidewall 170 and communicates with the opening 11 of the plasma chamber 10. The through-hole 181 has an inner diameter of 1 to 5 mm. In one example, the through-hole 181 may be provided to have a diameter of 4 mm. This connection opening block 180 may be made of an opaque material and may be absorbent. Therefore, horizontally straight plasma light may be easily guided in a direction toward the observation window 120.

The connection opening sidewall 170 and the connection opening block 180 may allow the plasma light from the opening 11 of the plasma chamber 10 to be directed to towards the observation window 120. In other words, the connection opening block 180 may act as a collimator to improve straightness of light. Therefore, the through-hole 181 of the connection opening block 180 improves the straightness of the plasma light traveling toward the observation window 120 and thus lowers conductance of the plasma.

When the connection opening sidewall 170 and the connection opening block 180 are provided, the tension roller 160 is positioned at each of both opposing sides around the through-hole 181 to allow one face of the transparent film 140 facing toward the through-hole 181 to be in close contact with the connection opening block 180.

In one example, the window device for plasma OES diagnosis according to an embodiment of the present disclosure further includes an optical fiber connector 190.

The optical fiber connector 190 is connected to an optical fiber of the OES (Optical Emission Spectroscopy) sensor for OES diagnosis of the plasma and is disposed out of the observation window opening 112 and is in close contact with the observation window 120. In one example, the optical fiber connector 190 may include an annular housing connector 191 and an optical fiber connection port 192 extending from the housing connector 191. In this case, the housing connector 191 may be fixed to an outer face of the housing 110 so as to cover an edge of the observation window 120.

Hereinafter, a process in which the window device for plasma OES diagnosis according to an embodiment of the present disclosure receives the plasma light and then transmits the same to the OES sensor will be described.

The plasma light of the plasma generated in the plasma chamber 10 is emitted through the opening 11 of the plasma chamber 10 and travels toward the connection opening block 180 facing toward the opening 11 of the plasma chamber 10.

The emitted plasma light enters the through-hole 181 of the connection opening block 180 and travels toward the transparent film 140 along the through-hole 181. In this connection, while the plasma light travels along the narrow through-hole 181, the straightness thereof is improved.

The plasma light passing through the through-hole 181 transmits through the transparent film 140. Then, the plasma light passing through the transparent film 140 travels toward the observation window opening 112.

The plasma light travelling toward the observation window opening 112 enters the observation window opening 112 and then transmits through the observation window 120. The plasma light passing through the observation window 120 enters an inside of the optical fiber connector 190.

The plasma light entering the optical fiber connector 190 is transmitted to the OES sensor via an optical fiber connected to the optical fiber connector 190. Thus, the OES sensor may diagnose the plasma state based on an analyzing result of the transmitted plasma light.

During this process, the contamination level identification means identifies the contamination level of the transparent film 140. In this connection, when the contamination level of the transparent film 140 is the preset upper limit of the contamination level, the means may deliver a signal indicating this event to the roll-to-roll driver 150.

The roll-to-roll driver 150 drives the winder 131 and the rewinder 132 when the signal from the contamination level identification means is input thereto. Thus, the transparent film 140 may move from the rewinder to the winder 131 and may be wound around the winder 131 by at least one a predefined length of the transparent film 140 corresponding to a diameter of the through-hole 181 of the connection opening block 180 such that a portion of the predefined length of the transparent film 140 is spaced from the through-hole 181. For example, at least a length of a portion of the transparent film 140 supported on the two tension rollers 160 may move toward the winder and may be wound around the winder 131. Accordingly, a contaminated portion of the transparent film 140 is spaced apart from the through-hole 181, and thus, a new uncontaminated portion of the transparent film 140 faces toward the through-hole 181.

The contamination level identification means continues to measure the contamination level of the transparent film 140 even in a process of replacing the contaminated portion of the transparent film 140 with the new uncontaminated portion thereof via the roll-to-roll movement of the transparent film 140.

In the window device for plasma OES diagnosis according to an embodiment of the present disclosure, the observation window 120 is not directly installed on the plasma chamber 10. Rather, a separate installation space for the observation window 120 is defined through the housing 110. Thus, the observation window 120 to receive the plasma light is spaced away from the plasma chamber 10.

In addition, the first chamber 113 and the second chamber 114 of the housing 110 accommodate therein the winder 131 and the rewinder 132, respectively, and the transparent film 140 moves, in the roll-to-roll manner, from the rewinder 132 to the winder 131. The transparent film 140 covers the inner face of the connection opening 111 communicating with the opening 11 through the plasma light of the plasma chamber 10 is exposed. Thus, the transparent film 140 may prevent the carrier gas and the process gas together with the plasma light emitted from the opening 11 of the plasma chamber 10 from entering the housing 110. Thus, the observation window 120 is prevented from being contaminated with the gases.

Further, the transparent film 140 may be contaminated with the gases emitted from the opening 11 of the plasma chamber 10. However, the transparent film 140 may move in a roll-to-roll manner. Thus, when a portion of the film 140 corresponding to the opening 11 of the plasma chamber 10 has been contaminated to have a contamination level of the upper limit value as measured by the contamination level identification means, another portion of the film 140 that is not contaminated may be positioned to face toward the opening 11 of the plasma chamber 10. Accordingly, the transparent film 140 through which the plasma light transmits may be replaced and maintained in a clean state or a state with a low contamination level at all times. The plasma light that passes through the transparent film 140 and travels toward the observation window 120 may not have decrease in intensity. Therefore, an accurate diagnosis of the state of the plasma based on the plasma light may be achieved.

Further, between the housing 110 and the opening 11 of the plasma chamber 10, the connection opening sidewall 170 and the connection opening block 180 may be disposed. The connection opening block 180 may be received within the inner space defined by the connection opening sidewall 170 and have the through-hole 181 communicating with the opening 11 of the plasma chamber 10. Thus, as the plasma light which is emitted from the opening 11 of the plasma chamber 10 and travels toward the observation window 120 passes through a small diameter of the through-hole 181, the straightness thereof may be improved. Accordingly, the plasma light may be easily transmitted to the observation window 120 positioned far away from the plasma chamber 10, so that the plasma light may be incident into the observation window 120 without loss thereof. This may increase the accurate diagnosis efficiency of the plasma state.

Therefore, when using the window device for plasma OES diagnosis according to an embodiment of the present disclosure, the contamination of the observation window 120 that receives the plasma light for plasma state diagnosis may be prevented. Further, the window device always receives the plasma light without lowering intensity of the plasma light so that the plasma state diagnosis may be performed accurately.

In one example, the window device for plasma OES diagnosis according to an embodiment of the present disclosure may be included in the plasma apparatus. Therefore, the disclosure may provide a plasma apparatus in which the window device for diagnosing plasma OES is installed. The plasma apparatus has the window device for diagnosing plasma OES according to an embodiment of the present disclosure, so that accurate diagnosis of plasma treatment of the semiconductor substrate, etc. and the plasma state may be achieved.

Descriptions of the presented embodiments are provided so that any person with ordinary skill in the art of the present disclosure may use or practice the present disclosure. Various modifications to these embodiments will be apparent to those skilled in the art of the present disclosure. The general principles defined herein may be applied to other embodiments without departing from the scope of the present disclosure. Thus, the present disclosure is not to be limited to the embodiments presented herein, but is to be construed in the widest scope consistent with the principles and novel features presented herein.

What is claimed is:

1. A window device for diagnosis of plasma OES (Optical Emission Spectroscopy), the window device comprising:
   a housing including a first chamber and a second chamber positioned adjacent to each other;
   a connection opening defined in one face of the housing and between the first chamber and the second chamber, wherein the connection opening faces toward an opening through which light of plasma from a plasma chamber is exposed to the connection opening;
   an observation window opening defined in an opposite face of the housing opposite to the connection opening, wherein the observation window opening is coaxial with the connection opening, wherein the light of the plasma transmits through the observation window opening, and is incident to a light receiver of an OES sensor;
   an observation window positioned inside the observation window opening and in the housing;
   a winder and a rewinder installed in the first chamber and the second chamber, respectively; and
   a transparent film moving, in a roll-to-roll manner, from the rewinder to the winder while covering an inner face of the connection opening in the housing;
   wherein the window device further comprises tension rollers respectively positioned at both opposing sides in a length direction of the connection opening so that the transparent film moves in the roll-to-roll manner while closely contacting an inner face of the connection opening.

2. The window device of claim 1, wherein the window device further comprises contamination level identification means for identifying ta contamination level of the transparent film exposed to the connection opening.

3. The window device of claim 2, wherein the window device further comprises a roll-to-roll driver, wherein when a contamination level identified by the contamination level identification means is greater than or equal to a predetermined value, the driver is configured to drive the winder and the rewinder such that the transparent film moves from the rewinder to the winder in a roll-to-roll manner by a predetermined length.

4. The window device of claim 1, wherein the window device further comprises:
   a connection opening sidewall extending outwardly from the connection opening while surrounding the connection opening; and
   a connection opening block received in an inner spaced defined by the connection opening sidewall, and having a through-hole defined therein.

5. The window device of claim 4, wherein the through-hole has an inner diameter of 1 to 5 mm.

6. The window device of claim 1, wherein the window device further comprises an optical fiber connector of the OES sensor installed out of the observation window opening.

7. The window device of claim 1, wherein the transparent film is heat-resistant and chemical-resistant.

8. A plasma apparatus including the window device for diagnosing plasma OES according to claim 1.

\* \* \* \* \*